(12) United States Patent
Antesberger et al.

(10) Patent No.: US 7,084,014 B2
(45) Date of Patent: Aug. 1, 2006

(54) METHOD OF MAKING CIRCUITIZED SUBSTRATE

(75) Inventors: Timothy Antesberger, Binghamton, NY (US); James W. Fuller, Jr., Endicott, NY (US); John J. Konrad, Endicott, NY (US); John Kresge, Binghamton, NY (US); Stephen Krasniak, Owego, NY (US); Timothy L. Wells, Apalachin, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 203 days.

(21) Appl. No.: 10/679,302

(22) Filed: Oct. 7, 2003

(65) Prior Publication Data

US 2005/0074924 A1 Apr. 7, 2005

(51) Int. Cl.
*H01L 21/82* (2006.01)
(52) U.S. Cl. ............... 438/128; 438/129; 257/E29.026
(58) Field of Classification Search ............... 438/128, 438/129; 257/E29.026
See application file for complete search history.

(56) References Cited

U.S. PATENT DOCUMENTS

| | | | |
|---|---|---|---|
| 4,865,873 A | 9/1989 | Cole, Jr. et al. | |
| 4,877,644 A | 10/1989 | Wu et al. | |
| 5,018,164 A | 5/1991 | Brewer et al. | |
| 5,264,108 A * | 11/1993 | Mayer et al. | 205/125 |
| 5,310,624 A | 5/1994 | Ehrlich | |
| 5,315,101 A * | 5/1994 | Hughes et al. | 250/208.1 |
| 5,843,806 A | 12/1998 | Tsai | |
| 5,968,847 A | 10/1999 | Ye et al. | |
| 6,429,908 B1 * | 8/2002 | Lim | 349/54 |
| 6,488,862 B1 | 12/2002 | Ye et al. | |
| 6,720,210 B1 * | 4/2004 | Chang | 438/128 |
| 6,809,335 B1 * | 10/2004 | Park | 257/59 |
| 2004/0007721 A1 * | 1/2004 | Forbes et al. | 257/204 |
| 2005/0074910 A1 * | 4/2005 | Kanamaru et al. | 438/18 |

* cited by examiner

*Primary Examiner*—Michelle Estrada
(74) *Attorney, Agent, or Firm*—Hinman, Howard & Kattell, LLP; Lawrence R. Fraley

(57) ABSTRACT

A method of making a circuitized substrate in which the substrate's commoning bar, used during the plating of the circuitry on the substrate, is terminated from the various conductors using a laser. In a preferred embodiment, the laser acts through a dielectric layer (soldermask) which is applied over the circuitry, including the commoning bar and connected parts. The laser may also be used to expose selected ones of the circuit's other parts, including various pads used to accommodate a wirebond (from a chip) and also solder balls for eventual placement of the substrate on a larger circuit board.

7 Claims, 5 Drawing Sheets

METHOD OF MAKING CIRCUITIZED SUBSTRATE

TECHNICAL FIELD

The invention relates to the manufacture of circuitized substrates such as printed circuit boards, chip carriers, and the like. More specifically, it relates to such substrates which include a plated circuit pattern on at least one surface thereof designed to accommodate one or more electronic components such as a semiconductor device (chip).

BACKGROUND OF THE INVENTION

Various types of circuitized substrates having plated, e.g., electroplated, circuitry thereon or as part thereof are known in the art, including those made and sold by the assignee of this invention. Examples of such substrates, including those of the integrated circuit (or semiconductor chip or device) category and various methods of manufacturing same are described in the following U.S. Letters Patents:

| | |
|---|---|
| 4,865,873 | Cole, Jr., et al |
| 4,877,644 | Wu et al |
| 5,018,164 | Brewer et al |
| 5,310,624 | Ehrlich |
| 5,264,108 | Mayer et al |
| 5,843,806 | Tsai |
| 5,968,847 | Ye et al |
| 6,488,862 B1 | Ye et al |

One particularly attractive circuitized substrate made and sold by the assignee of the invention is called the HyperBGA chip carrier, which includes a laminate substrate-conductor layer structure on which is positioned one or more semiconductor chips. (HyperBGA is a registered trademark of Endicott Interconnect Technologies, Inc.). The carrier is then positioned on and electrically coupled to a printed circuit board (PCB) or other suitable substrate and this entire subassembly in then utilized in an electronic assembly such as a personal computer, server, etc. The latter assemblies are often referred to generically in the industry as "information handling systems".

Examples of such a chip carrier are defined in filed applications Ser. No. 10/394,135 and Ser. No. 10/394,107, both filed Mar. 24, 2003 and assigned to the same assignee as the invention.

Yet another chip carrier made and sold by the assignee of this invention is referred to as a wirebond, laminate chip carrier in which the chip is coupled to surface conductors by wirebonds. In the typical HyperBGA carrier, the chip is coupled to the surface conductors on the substrate by solder ball connections.

In the formation of such laminate substrates, if electroplating is utilized, a "commoning bar" is typically used as part of the circuitry to form a common connection to the desired circuit elements, e.,g., pads or lines, being plated up with the desired metal, e.g., copper. Such a process requires the use of various masking steps in combination with photolithographic processing, both adding cost to the final product.

The present invention overcomes the aforementioned disadvantages associated with such substrate manufacture (applicable not only to chip carriers but also to larger PCBs and the like substrates) by eliminating these additional steps while still providing an efficient, less complex process that will still assure an excellent final substrate product. Because of this, the resulting assembly using same will also inherit the beneficial advantages, especially reduced cost, thereof. It is believed that a method of making a circuitized substrate that will provide such advantages will constitute a significant advancement in the art, as will the resulting substrate and the information handling systems which utilize said product.

OBJECTS AND SUMMARY OF THE INVENTION

It is, therefore, a primary object of the present invention to enhance the art of substrate manufacture.

It is another object of the invention to provide a finished substrate which is produced in an efficient, effective manner and which can then be utilized successfully in an assembly such as described hereinabove.

According to one aspect of the invention, there is provided a method of making a circuitized substrate, comprising providing a first dielectric layer having a first surface, forming a first pattern of conductors and a second pattern of conductors spaced from the first pattern and electrically coupled thereto on the first surface of the first dielectric layer, forming a common conductive line on the first surface of the first dielectric layer electrically connected to each of the conductors of the second pattern of conductors, and thereafter terminating the electrical connections between each of the conductors of the second pattern of conductors and the common conductive line using a laser.

According to another aspect of the invention, there is provided a method of making a circuitized substrate, comprising providing a first dielectric layer having a first surface, forming a first pattern of conductors and a second pattern of conductors spaced from the first pattern and electrically coupled thereto on the first surface of the first dielectric layer, forming a common conductive line on the first surface of the first dielectric layer electrically connected to each of the conductors of the second pattern of conductors by a second conductive line, positioning a second dielectric layer substantially over the first and second patterns of conductors and common conductive line, providing openings in the second dielectric layer using a laser to expose at least portions of the conductive lines which electrically couple the second pattern of conductors to the common conductive lines, and thereafter severing the portions of the conductive lines which electrically couple the second pattern of conductor to the common conductive line.

According to yet another aspect of the invention, there is provided a circuitized substrate comprising a first dielectric layer having a first surface, first and second patterns of conductors spacedly positioned on the first surface, a plurality of connecting lines each connecting one of the conductors in the first pattern of conductors to a respective one of the conductors in the second pattern of conductors, a common first conductive line on the first surface of the first dielectric layer and a plurality of laser-severed second conductive lines which previously connected the common conductive line to the second pattern of conductors, and a second dielectric layer positioned on the first surface of the first dielectric layer.

In accordance with still another aspect of the invention there is provided an information handling system comprising an electronic package including a circuitized substrate having a first dielectric layer having a first surface, first and second patterns of conductors spacedly positioned on the first surface, a plurality of connecting lines each connecting one of the conductors in the first pattern of conductors to a respective one of the conductors in the second pattern of conductors, a common first conductive line on the first surface of the first dielectric layer and a plurality of laser-severed second conductive lines which previously connected the common conductive line to the second pattern of conductors, and a second dielectric layer positioned on the first surface of the first dielectric layer.

According to another aspect of the invention there is a method of making a circuitized substrate, comprising provided a first dielectric layer having a first surface and a second opposing surface, forming a first pattern of conductors and a second pattern of conductors spaced from the first pattern and electrically coupled thereto on the first surface of the first dielectric layer, forming a common conductive line on the second opposing surface of the first dielectric layer and electrically connected to each of the conductors of the second pattern of conductors, and thereafter terminating the electrical connections between each of the conductors of the second pattern of conductors and the common conductive line using a laser.

In accordance with still another aspect of the invention there is provided a method of making a circuitized substrate, comprising a first dielectric layer having a first surface and a second opposing surface, forming a first pattern of conductors and a second pattern of conductors spaced from the first pattern and electrically coupled thereto on the first surface of the first dielectric layer, forming a common conductive line on the second opposing surface of the first dielectric layer and electrically connected to each of the conductors of the second pattern of conductors by a second conductive line, positioning a second dielectric layer substantially over the first and second patterns of conductors and a third dielectric layer over the common conductive line, providing openings using a laser to expose at least portions of the conductive lines which electrically couple the second pattern of conductors to the common conductive lines, and thereafter severing the portions of the conductive lines which electrically couple the second pattern of conductors to the common conductive line.

In accordance with yet another aspect of the invention there is provided a circuitized substrate, comprising a first dielectric layer having a first surface and a second, opposing surface, first and second patterns of conductors spacedly positioned on the first surface, a plurality of connecting lines each connecting one of the conductors in the first pattern of conductors to a respective one of the conductors in the second pattern of conductors, a common first conductive line on the second opposing surface of the first dielectric layer and a plurality of laser-severed second conductive lines which previously connected the common conductive line to the second pattern of conductors, and second and third dielectric layers positioned on the first and second opposing surfaces of the first dielectric layer, respectively.

According to another aspect of the invention there is provided an information handling system comprising an electronic package including a circuitized substrate having a first dielectric layer having a first surface and a second opposing surface, first and second patterns of conductors spacedly positioned on the first surface, a plurality of connecting lines each connecting one of the conductors in the first pattern of conductors to a respective one of the conductors in the second pattern of conductors, a common first conductive line on the second opposing surface of the first dielectric layer and a plurality of laser-severed second conductive lines which previously connected the common conductive line to the second pattern of conductors, and second and third dielectric layers positioned on the first and second opposing surfaces of the first dielectric layer, respectively.

In accordance with still another aspect of the invention there is provided a method of making a circuitized substrate, comprising providing a first dielectric layer having a first surface and a second opposing surface, forming a first pattern of conductors on the first surface and a second pattern of conductors on the second surface and electrically coupled to the first pattern of conductors on the first dielectric layer, forming a common conductive line on the second opposing surface of the first dielectric layer electrically connected to each of the conductors of the second pattern of conductors, and thereafter terminating the electrical connections between each of the conductors of the second pattern of conductors and the common conductive line using a laser.

According to yet another aspect of the invention there is provided a method of making a circuitized substrate comprising providing a first dielectric layer having a first surface and a second opposing surface, forming a first pattern of conductors on the first surface and a second pattern of conductors on the second opposing surface and electrically coupled to the first pattern of conductors on the first dielectric layer, forming a common conductive line on the second opposing surface of the first dielectric layer electrically connected to each of the conductors of the second pattern of conductors by a second conductive line, positioning a second dielectric layer substantially over the first pattern of conductors and a third dielectric layer over the second pattern of conductors and common conductive line, providing openings in the third dielectric layer using a laser to expose at least portions of the conductive lines which electrically couple the second pattern of conductors to the common conductive lines, and thereafter severing the portions of the conductive lines which electrically couple the second pattern of conductors to the common conductive line.

In accordance with another aspect of the invention there is provided a circuitized substrate comprising a first dielectric layer having a first surface and a second opposing surface, a first pattern of conductors positioned on the first surface, a second pattern of conductors positioned on the second surface, a plurality of connecting lines each connecting one of the conductors in the first pattern of conductors to a respective one of the conductors in the second pattern of conductors, a common first conductive line on the second surface of the first dielectric layer and a plurality of laser-severed second conductive lines which previously connected the common conductive line to the second pattern of conductors, and second and third dielectric layers positioned on the first and second opposing surfaces of the first dielectric layer, respectively.

Finally, in accordance with still another aspect of the invention there is provided an information handling system comprising an electronic package including a circuitized substrate having a first dielectric layer having a first surface and a second opposing surface, a first pattern of conductors positioned on the first surface, a second pattern of conductors positioned on the second opposing surface, a plurality of connecting lines each connecting one of the conductors in the first pattern of conductors to a respective one of the conductors in the second pattern of conductors, a common first conductive line on the second opposing surface of the first dielectric layer and a plurality of laser-severed second conductive lines which previously connected the common conductive line to the second pattern of conductors, and second and third dielectric layers positioned on the first and second opposing surfaces of the first dielectric layer, respectively.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

"Information Handling System" as used herein shall mean any instrumentality or aggregate of instrumentalities primarily designed to computer, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc.

Figure 1:
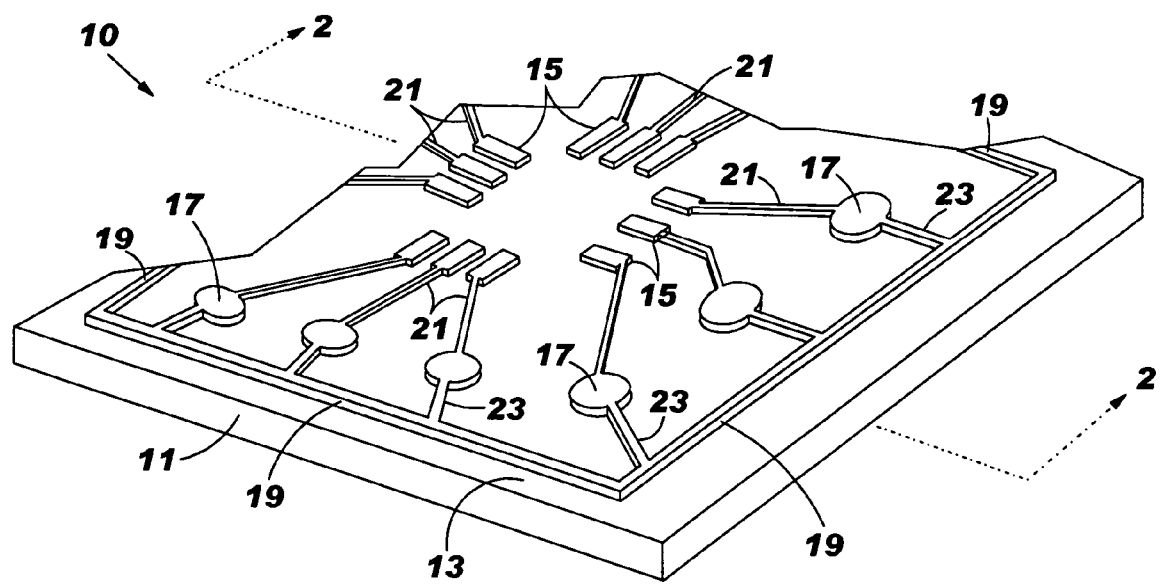
FIG. 1 is a perspective view of a circuitized substrate according to one aspect of the invention including one example of a dielectric layer and conductive circuitry thereon prior to further processing using the teachings of the instant invention.

In FIG. 1, there is seen a partial circuitized substrate 10 according to one aspect of the invention. Substrate 10 includes a first dielectric layer 11 having an upper, first surface 13 thereon. A preferred material for layer 11 is Teflon (a trademark of E. I. duPont de Nemours and Company), with other suitable dielectric materials being fiberglass-reinforced polymer resin, and polyimide. Such materials are known in the art and further description is not believed necessary.

As stated, a preferred example of the final product utilizing substrate 10 is a laminate chip carrier or the like such as that made and sold by the assignee of the invention under the product name HyperBGA and the aforementioned wirebonded, laminated chip carrier. The invention is not limited, however, to the manufacture of such substrates but instead is applicable to many other circuitized substrates, including, e.g., PCBs known in the art.

On the upper surface 13 is formed a first pattern of electrical conductors 15 and a second pattern of conductors 17 spaced from respective ones of the first conductors 15 and electrically coupled thereto, as shown. In a preferred embodiment, both patterns of conductors are made of copper. As will be described below, in a preferred embodiment of the invention, the first pattern of conductors 15 are designed for being electrically connected directly to a semiconductor chip. In said embodiment, the second, spaced conductors 17 are in turn adapted for having a solder ball or the like positioned thereon so as to be electrically coupled to an exterior electronic component such as a PCB. Further description will be provided below.

In the preferred method of forming the patterns of conductors as shown in FIG. 1, these conductors are electroplated using a conventional electrolytic plating process which typically involves plating a solid copper layer and then subtractively etching portions thereof to precisely define the desired circuit patterns. In such an electrolytic process, a common conductive line 19 is also formed on surface 13 and in turn forms an integral part of the initial circuit pattern as shown in FIG. 1. Common conductive line 19 thus serves as a common electrical connector to all of the conductors in each pattern during the electrolytic plating. In this initial pattern, each of the first pattern of conductors 15 is electrically coupled to a respective one of the second pattern of conductors by a conductive line 21 while each of the second pattern of conductors 17 is in turn electrically coupled to the common conductive line 19 by an individual conductive line 23. It is understood that the number of conductors in each of the patterns shown in FIG. 1 is only representative of one possible arrangement, in that several additional such conductors for each pattern are possible (and more likely). In one example of the invention, a total of 456 internal conductors 15 were utilized and a corresponding number of 560 outer conductors 17 used. It is thus understood that respective ones of the inner conductors may be connected to more than one outer conductor according to the teachings herein. The pattern shown is also not meant to limit the invention in that there may be several alternative patterns utilized. For example, the outer conductors 17 may be oriented in two or more linear rows along each side of the substrate with the respective conductive lines 21 interleaved through the pattern to reach its corresponding outer conductor.

In a preferred embodiment, the underlying dielectric layer may in fact include several internal conductive planes having signal and/or power connections therein for being electrically coupled, e.g., using conventional plated through hole technology, to respective ones of the outer conductors 17 as well as inner conductors 15, if desired. In the aforementioned filed patent applications defining the HyperBGA chip carrier, the carrier includes various internal conductive layers designed for this purpose. These filed patent applications are thus incorporated herein by reference. Such internal layers are also readily usable in a wirebonded, laminate chip carrier, such as the one mentioned above.

Figure 2:
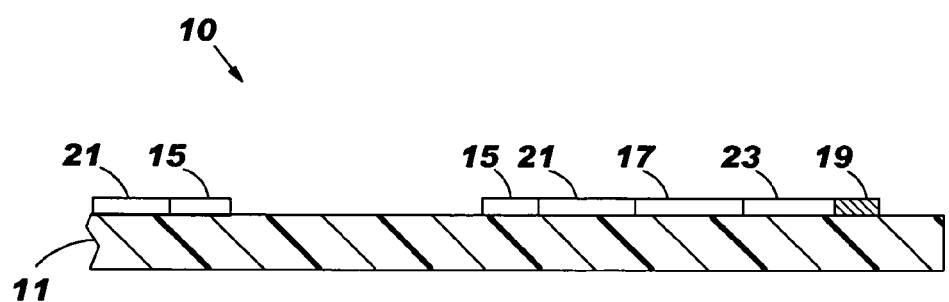
FIG. 2 is a side elevational view, in section, of the substrate of FIG. 1, taken along the line 2—2 in FIG. 1.

FIG. 2 is a side elevational view, slightly enlarged, taken along the line 2—2 in FIG. 1, showing partly in cross-section, the elements shown in FIG. 1. It is again worth mentioning that although internal conductive planes are not shown in the cross-sectional view of FIG. 2, such internal planes are preferably utilized in the present invention, as stated above.

Figure 3:
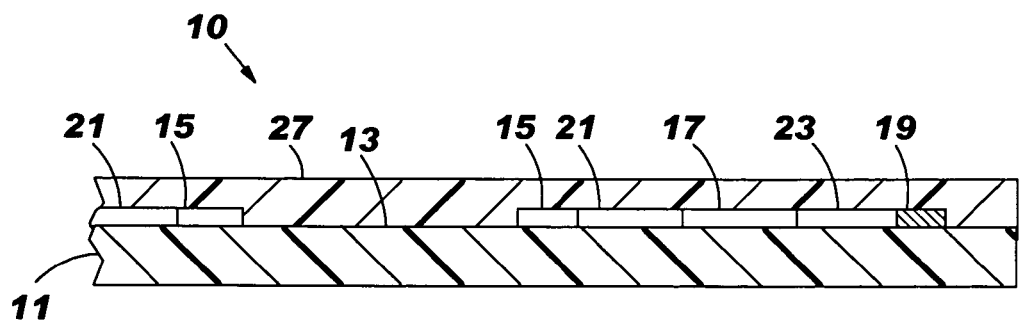
FIGS. 3 and 4 are enlarged side elevational views similar to FIG. 2 showing the addition of a dielectric layer and further processing.

In FIG. 3, a second dielectric layer 27 is shown as being positioned atop surface 13 of layer 11 and also covering the circuit pattern, including the inner and outer conductors and common conductive line. In a preferred embodiment, this second dielectric layer is a solder mask of conventional material and is in liquid form and flowed onto layer 11 and cured. Alternatively, the second (and third, described below) dielectric layers can be provided in dry film form and laminated onto layer 11. One example of such a liquid solder mask material is sold under the product name PSR 4000 BN and is available from Taiyo, Inc., having a place of business in Carson City, Nev. With a dielectric layer 11 having a thickness of about 0.030 inch, and a respective circuitry pattern as shown having an approximate thickness of only about 0.0006 inch to about 0.001 inch, a second (and third, if used—see below) dielectric layer 27 having a thickness of 0.0015 inch is preferred.

As stated above, it was heretofore necessary in the formation of a substrate of the type taught herein to utilize a photolithographic process also involving the use of various masking steps to define the final product. It will be understood from the following, that the present invention eliminates the need for such a photolithographic process and the added expenses associated therewith.

Figure 4:
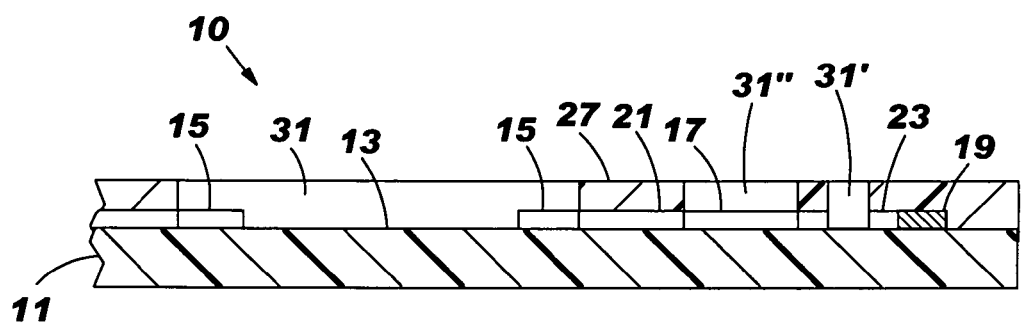

In FIG. 4, selected portions of the second dielectric layer 27 are removed above the pattern of first conductors 15 and the second conductors 17. Regarding this first pattern, the second dielectric material 27 is also removed from the upper surface 13 between such opposed conductors 15, thus leaving a relatively large opening 31 within the second dielectric material and a relatively large portion of the upper surface 13 of layer 11 also exposed. In contrast, only the portions of material 27 above the respective second conductors 17 are removed. This is considered important in the present invention if the second conductors 17 are expected to accommodate a solder ball as described above (and shown below), the second dielectric thus serving as such a solder mask. Significantly, the removal of the second dielectric layer 27 is accomplished using a laser, e.g., a YAG or $CO^2$ laser. Simultaneously with such removal, the desired laser also terminates the connection at line 23 between each of the outer conductors 17 and the common conductive line 19. Of further importance, the laser removal of material 27 to complete these termination results in partial removal of the material from upper surface 13 of layer 11, as shown to the right in FIG. 4. That is, the formed opening 31' is deeper than that of large opening 31 and the respective openings (31") above each outer conductor 17. Partial removal of the dielectric layer 11 to this extent is desired to assure complete severance of line 23 which might have contained remnants of conductor therein should such a depth of removal not have occurred.

Figure 7:
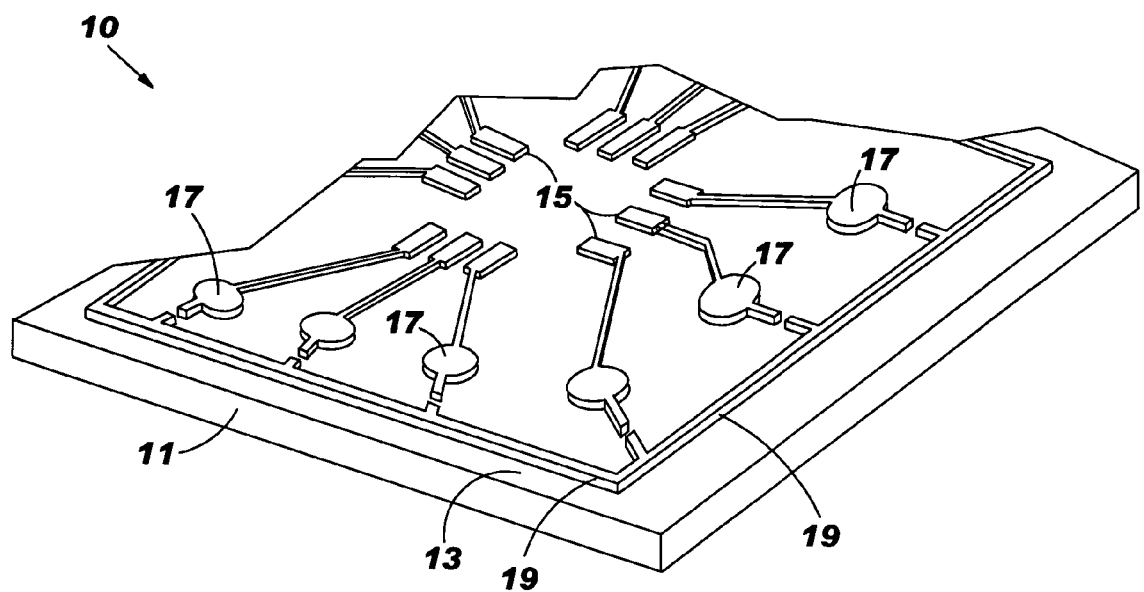
FIG. 7 is a perspective view showing the substrate of the invention following a termination step in accordance with a preferred embodiment of the invention (the second dielectric layer being absent for enhanced illustration purposes)

FIG. 7 represents a perspective view of the substrate 10 at the step shown in FIG. 4, absent the presence of the described second dielectric layer 27 for enhanced illustration purposes. It is clearly seen that each of the outer conductors 17 has been severed from its connection to the common conductive line 19. The remaining connections between these outer conductors and the corresponding inner conductors 15 remain intact. Thus the instant invention has shown a method of instantaneously removing desired dielectric material from selected areas above the invention's conductors as well as terminate selected ones of said conductors from the respective common conductive line used during the plating thereof such that the final pattern will not be connected together but able to operate in the desired, individual connection scheme necessary for the final package using substrate 10.

In one embodiment, the outer conductive line 19 will remain in the final substrate but it is also within the scope of the invention to remove this conductive line. Retaining it thus saves manufacturing costs while not distracting from the overall appearance or operational capabilities of the final product.

Figure 5:
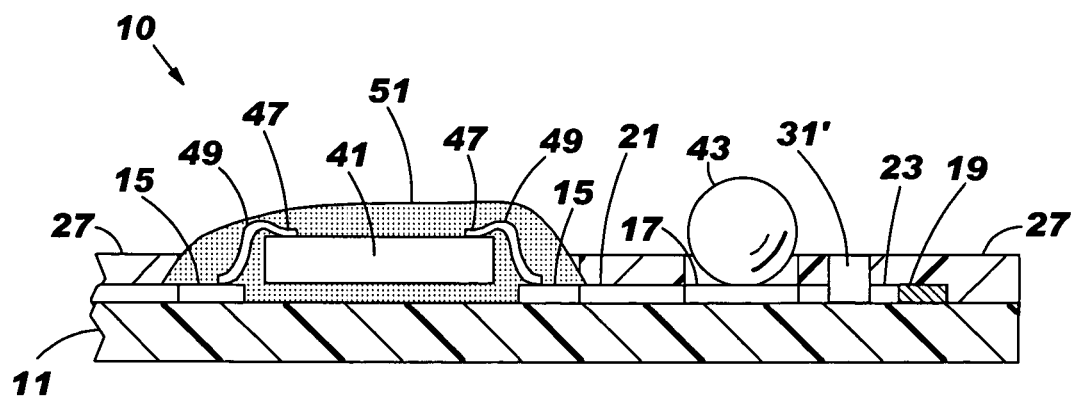
FIG. 5 is a side elevational view, in section, of a completed circuitized substrate made in accordance with preferred embodiments of the teachings of the invention.
Figure 6:
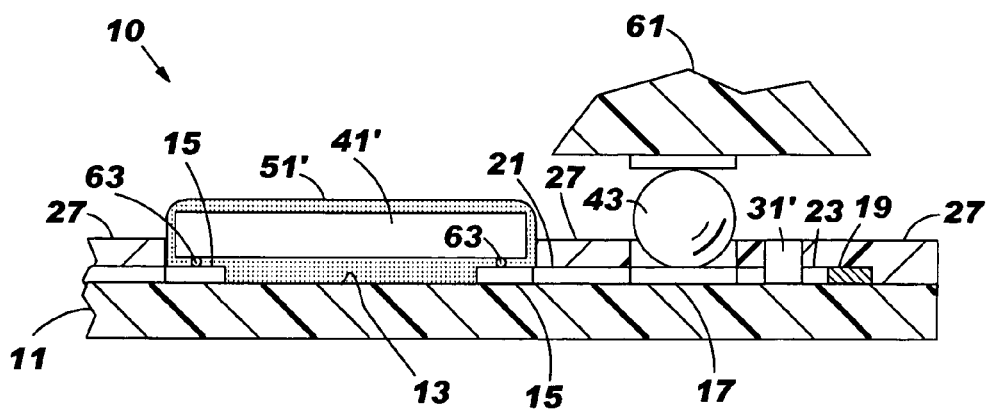
FIG. 6 is a side elevational view, in section, of a completed circuitized substrate according to an alternative embodiment of the invention, showing the substrate electrically coupled to a second substrate such as a PCB or the like and thus forming an information handling system as defined herein.

In FIG. 5, further processing is shown for substrate 10, including the addition of a semiconductor chip 41 and an outer solder ball 43. Chip 41 is preferably positioned on upper surface 13 of layer 11 and adhered thereto using an appropriate conventional cement 45. Once positioned, the chip's upper contact sites 47 are in turn electrically coupled to respective ones of the individual conductors 15 using a plurality of wirebonds 49. Wirebond coupling is known in the art and further description is not believed necessary. Following wirebond, an encapsulant material 51 is positioned as shown to encase the relatively delicate wires 49 and protect the chip and underlying connections as shown. In addition to chip placement, a solder ball 43 is positioned on each of the respective outer conductors 17 using conventional solder ball placement apparatus. In one example, each solder ball was comprised of 63:37 tin/lead, and often referred to as a eutectic solder ball. One ball 43 is used for each outer conductor 17, including 560 such solder balls for the substrate defined hereinabove. The structure shown in FIG. 5 is thus operational as an electronic package to electrically couple the semiconductor chip to the respective outer pads 17 for eventual coupling to an external circuitized substrate such as a printed circuit board 61 (FIG. 6). When in position, the solder balls 43 are reflowed and a final connection occurs. The result is an electronic package having the circuitized substrate of the invention as part thereof electrically coupled to a larger circuitized substrate such as a PCB, which can then form an information handling system of the type described herein. Examples of such systems include personal computers, servers, mainframes, etc.

In FIG. 6, a chip 41' has been positioned within the large opening 31 as provided in FIG. 4, similarly to chip 41 in FIG. 5. In the embodiment of FIG. 6, however, chip 41' is positioned over conductors 15 and electrically coupled thereto using respective solder balls 63. Chip 41' is thus referred to as a flip chip and solder balls 63 are preferably also of a 63:37 tin-lead composition, compared to the composition for the outer solder balls 45. An encapsulant 51' is also utilized to seal the chip and underlying connections between the chip's contact sites (not shown) on the chip's under surface to solder balls 43 and the connection between said solder balls and conductors 15.

Figure 8:
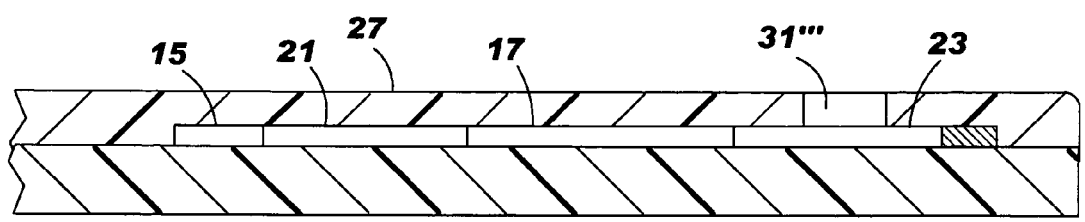
FIGS. 8 and 9 are side elevational views, in section, illustrating an alternative method of the invention.
Figure 9:
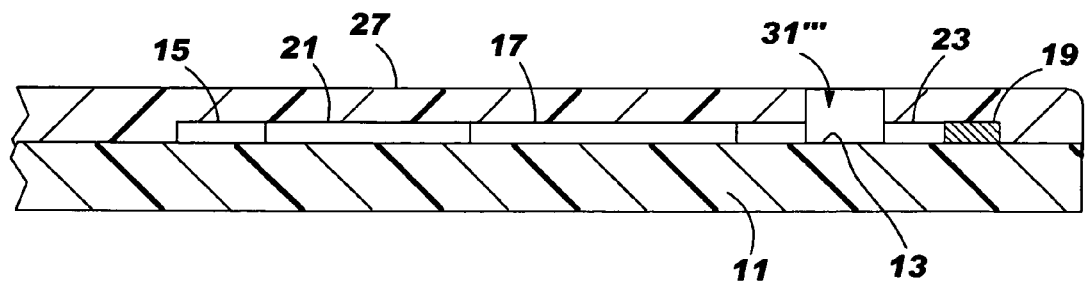

FIGS. 8 and 9 represent an alternative embodiment of the invention. A second dielectric layer 27 similar to that applied in the above embodiment is applied, preferably by lamination as occurred above. Severance of the outer conductive lines 23 is preferably accomplished in this embodiment by initial removal (using a laser, as above) of dielectric material above the outer connecting line 23, showing a first opening 31''' only to the depth of the conductor 23 upper surface. (It is understood that simultaneous removal of remaining selected portions of layer 27 may also occur at this time; however, such removal is not shown in FIGS. 8 and 9 for ease of illustration.) In the next step following removal of the dielectric 27 above line 23, the portion of line 23 to be removed is now removed, preferably using an etchant which etches through the line to the upper surface 13 of layer 11. Severance of line 23 thus occurs. Understandably, this dual operation occurs for each of the outer connecting lines 23 in the desired circuit pattern for substrate 10. The preferred etchant is cupric chloride, one example being available from Mallinckrodt Baker of Phillipsburg, N.J.

Figure 10:
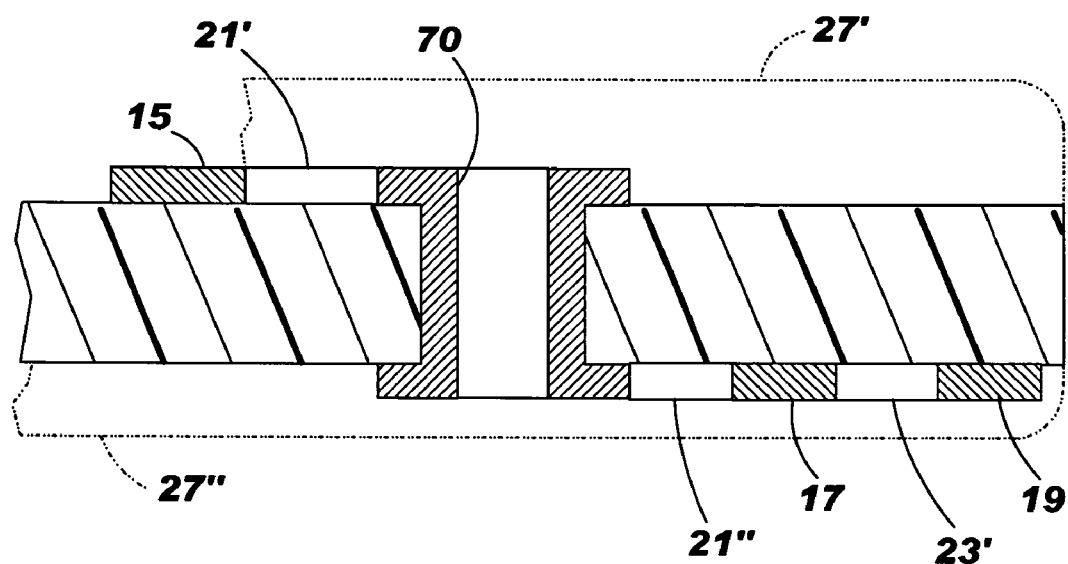
FIGS. 10 and 11 are also side elevational views, in section, illustrating two different methods of forming the circuitized substrates of the invention, and the resulting configurations thereof.

In FIG. 10, there is shown an alternative embodiment of the invention. In comparison to the substrate of FIGS. 1 and 2, the substrate of FIG. 10 includes only the pattern of first conductors 15 on the dielectric layer's first (top) surface and the second pattern of conductors 17 is instead formed (preferably simultaneously with the first pattern) on the layer's second (bottom) opposing surface. Electrical coupling between patterns is through the dielectric layer using a plated through hole 70. A connecting conductive line 21' couples each conductor 15 to the land of through hole 70, as shown, and a conductive line 21" completes the coupling to conductor 17 on the undersurface. Conductors 17 and common line 19 (also formed on the bottom, undersurface) are coupled by conductive line 23'. Understandably, line 23' is severed by the described laser to terminate the conductor-common line connection. In the FIG. 10 embodiment, second and third dielectric layers 27' and 27" are applied, respectively, to the upper and lower surfaces of the substrate's initial dielectric layer and are preferably of the liquid soldermask material mentioned above.

Thus it is seen in the FIG. 10 structure that the larger conductors (pads) 17, which will preferably have the aforementioned solder balls bonded thereto for coupling to a second substrate (e.g., PCB) are located on the lower, undersurface of the substrate. Use of the circuitry arrangement of FIG. 10 allows for greater utilization of top surface real estate, e.g., for greater circuitry (not shown).

Figure 11:
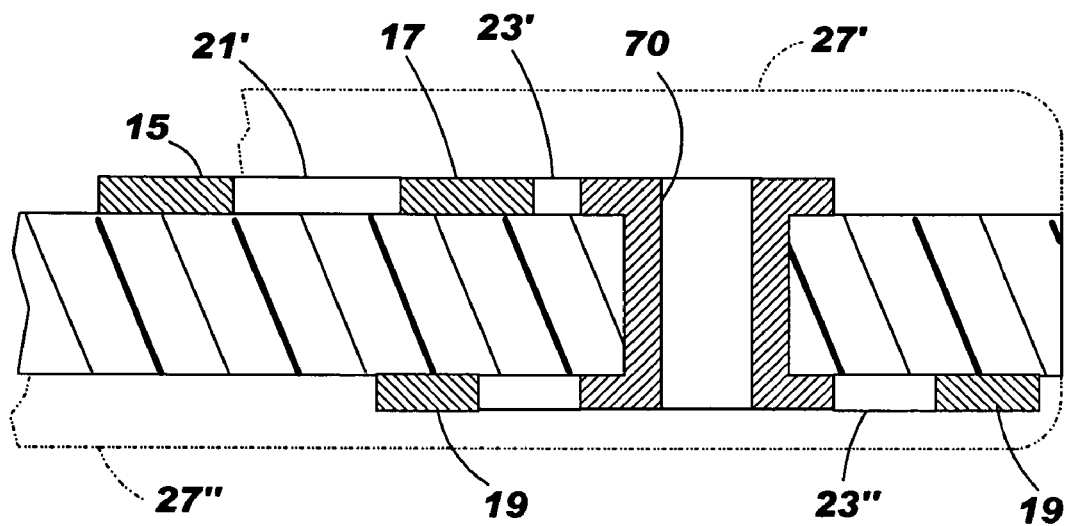

The embodiment of FIG. 11 is similar to that of FIG. 10 except that the second pattern of conductors 17 are formed on the upper surface of the substrate, as in the FIG. 1 embodiment. Connection between conductors 17 and common line 19 (located on the lower, opposing surface) is accomplished using plated through holes 70 and two conductive lines 23' and 23". The termination (severance) is preferably accomplished at line 23" but could be achieved on the substrate's upper surface at line 23'. Both second and third dielectric layers are also seen in FIG. 11. Of significance, it is possible to form common conductive line 19 "in board" of through hole 70 as opposed to the position shown in solid. This alternative position for line 19 is shown to the left of hole 70 in FIG. 11 and represents a significant savings in substrate real estate, which can be used for other purposes, especially more circuitry. Understandably, only one such common line 19 will be used in the FIG. 11 embodiment.

In both of the embodiments of FIGS. 10 and 11, the circuitry on both sides is preferably formed simultaneously, in the manner defined for the circuitry of the FIG. 1 embodiment. Further description is not believed necessary.

Thus there has been shown and described a method of making a circuitized substrate in a new and unique manner which eliminates the need for previously utilized processing steps (especially photolithographic processing) to produce an acceptable final product for market. The method as taught herein can be accomplished in a facile manner and in relatively less time than the method described in the Background above. The resulting substrate, as defined, is readily adaptable as part of an information handling system.

While there have been shown and described what are at present the preferred embodiments of the invention, it will be obvious to those skilled in the art that various changes and modifications may be made therein without departing from the scope of the invention as defined by the appended claims.

What is claimed is:

1. A method of making a circuitized substrate, said method comprising:
   providing a first dielectric layer having a first surface;
   forming a first pattern of conductors and a second pattern of conductors spaced from said first pattern and electrically coupled thereto on said first surface of said first dielectric layer;
   forming a common conductive line on said first surface of said first dielectric layer electrically connected to each of said conductors of said second pattern of conductors;
   providing a second dielectric layer in liquid form and flowing said second dielectric layer onto said first dielectric layer and substantially over said first and second patterns of conductors; and
   thereafter terminating said electrical connections between each of said conductors of said second pattern of conductors and said common conductive line using a laser.

2. The method of claim 1 wherein said second dielectric layer comprises a soldermask.

3. A method of making a circuitized substrate, said method comprising:
   providing a first dielectric layer having a first surface;
   forming a first pattern of conductors and a second pattern of conductors spaced from said first pattern and electrically coupled thereto on said first surface of said first dielectric layer;
   forming a common conductive line on said first surface of said first dielectric layer electrically connected to each of said conductors of said second pattern of conductors;
   thereafter terminating said electrical connections between each of said conductors of said second pattern of conductors and said common conductive line using a laser; and
   positioning a semiconductor chip on said first dielectric layer and electrically coupling said semiconductor chip to said first pattern of conductors.

4. The method of claim 3 wherein said electrically coupling of said semiconductor chip to said first pattern of conductors is accomplished using a wirebonding operation.

5. The method of claim 3 wherein said semiconductor chip is electrically coupled to said first pattern of conductors using a plurality of solder balls.

6. A method of making a circuitized substrate, said method comprising:
   providing a first dielectric layer having a first surface;
   forming a first pattern of conductors and a second pattern of conductors spaced from said first pattern and electrically coupled thereto on said first surface of said first dielectric layer;
   forming a common conductive line on said first surface of said first dielectric layer electrically connected to each of said conductors of said second pattern of conductors;
   positioning a second dielectric layer substantially over said first and second patterns of conductors; and
   thereafter terminating said electrical connections between each of said conductors of said second pattern of conductors and said common conductive line using a laser while simultaneously using said laser to provide openings in said second dielectric layer above respective ones of said electrical connections.

7. The method of claim 6 wherein said laser also partially removes some of said first dielectric layer immediately below said electrical connections during said terminating of said connections.

\* \* \* \* \*